(12) United States Patent  
Ranta (10) Patent No.: US 7,289,069 B2  
(45) Date of Patent: Oct. 30, 2007

(54) WIRELESS DEVICE ANTENNA

(75) Inventor: Tero Ranta, Turku (FI)

(73) Assignee: Nokia Corporation, Espoo (FI)

( * ) Notice: Subject to any disclaimer, the term of this patent is extended or adjusted under 35 U.S.C. 154(b) by 105 days.

(21) Appl. No.: 11/029,632

(22) Filed: Jan. 4, 2005

(65) Prior Publication Data

US 2006/0145931 A1 Jul. 6, 2006

(51) Int. Cl.
*H01Q 1/24* (2006.01)
(52) U.S. Cl. .............................. 343/702; 343/700 MS
(58) Field of Classification Search ............... 343/702, 343/700 MS
See application file for complete search history.

(56) References Cited

U.S. PATENT DOCUMENTS

| | | | | |
|---|---|---|---|---|
| 5,451,965 A | * | 9/1995 | Matsumoto | 343/702 |
| 5,542,106 A | * | 7/1996 | Krenz et al. | 455/575.7 |
| 5,608,413 A | * | 3/1997 | Macdonald | 343/700 MS |
| 5,990,839 A | * | 11/1999 | Schefte et al. | 343/702 |
| 6,907,200 B2 | * | 6/2005 | Okuno | 398/147 |
| 6,963,309 B2 | * | 11/2005 | Andersson et al. | 343/702 |
| 7,010,334 B2 | * | 3/2006 | Saito | 455/575.7 |
| 7,102,578 B2 | * | 9/2006 | Minemura | 343/702 |
| 7,126,547 B2 | * | 10/2006 | Kim et al. | 343/702 |
| 7,130,591 B2 | * | 10/2006 | Iwai et al. | 455/90.3 |
| 2004/0017315 A1 | * | 1/2004 | Fang et al. | 343/700 MS |

* cited by examiner

*Primary Examiner*—Hoanganh Le
(74) *Attorney, Agent, or Firm*—Ware, Fressola, Van Der Sluys & Adolphson (57) ABSTRACT

A wireless device antenna is constructed using flex-rigid printed wiring board technology wherein a first main printed wiring board is flexibly connected to a second printed wiring board carrying at least one radiating element having an approximate length, width and pattern defining an intended antenna functionality which may be cellular, non-cellular or both. The first main printed wiring board and the second printed wiring board are flexibly and electrically connected to one another by a flexible element. An RF transmission line formed in the metallization layers common to the first main printed wiring board and the second printed wiring board connect transceiver circuitry carried on the first main printed wiring board to respective radiating elements carried on the second printed wiring board.

25 Claims, 3 Drawing Sheets

WIRELESS DEVICE ANTENNA

FIELD OF THE INVENTION

The present invention relates generally to wireless portable electronic devices for example, mobile telephones and deals more particularly with a wireless device integrated flex-rigid antenna. The invention more specifically deals with using flex-rigid printed wiring board (PWB) technology to integrate one or more antennas with the wireless device motherboard.

BACKGROUND OF THE INVENTION

The mobile wireless industry particularly the mobile telephone industry is under increasing pressure to bring products to market in shorter timeframes with increased performance and more features. This demand has forced designers to further integrate functions and reduce component part count and further concentrate on improved size reduction. One solution has been to use an internal antenna to provide cellular system, for example, GSM, WCDMA and non-cellular system, for example, Bluetooth, WLAN, BVB-H, UWB, FM-Radio communication functionality. The number of supported systems directly increases the number of required antennas, which results in a substantial increase in the component part count. Traditionally the antenna whether internal or external, has been a separate component and the parts are inserted in the mobile telephone mechanics, that is, the physical assembly of the mobile telephone. The radiating element of the separate antenna is typically connected to the mobile telephone motherboard via gold-plated pins or springs. Typically one pin is used for the feed and the other for the ground connection. Multi-band antennas typically use even more pins than a single band antenna.

A conventional known internal antenna typically comprises a metallic thin foil, radiating element that is suitably attached by gluing, welding or other appropriate attachment methods to a suitably configured plastic form. This plastic form often has multiple functions particularly in mobile telephones with an internal cellular antenna and which plastic form will also act as the acoustic cavity for the internal hands-free operation loudspeaker. In such multiple function designs, the mobile telephone motherboard is typically used as the ground plane for the antenna and the plastic form is dimensioned and shaped to maintain the antenna in a desired spaced relationship with the motherboard.

Figure 1:
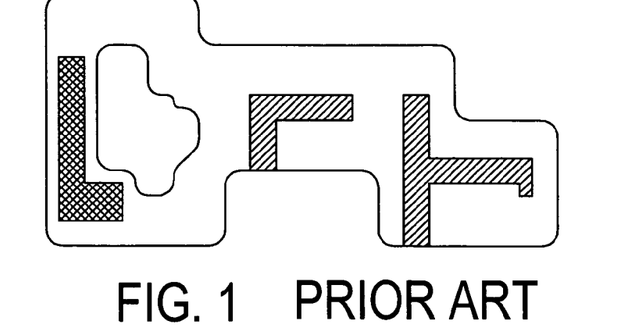
FIG. 1 shows a prior art flexible antenna.

It is known to use flex-rigid technology for antennas and for baseband level electrical circuit operation applications. Typically the flex-rigid technology is used to electrically connect two printed wiring boards (PWB) together to accommodate packaging requirements or other physical packaging restraints. However it is not known to use flex-rigid technology to integrate the antenna with the wireless device motherboard. It is also known to provide a Bluetooth antenna internal to a wireless device wherein a single antenna-radiating element is carried on a flexible substrate and connected to the wireless device motherboard in a conventional well-known manner employing connectors between the flexible substrate and the motherboard. A separate flexible substrate is required to carry a corresponding different band antenna. Such flexible substrate antennas are available for example from MAXON-MOBITENNA located in Denmark. A flexible substrate antenna typical of the prior art is illustrated schematically in FIG. 1.

In foldable mobile telephones, such as for example, clam-shell type mobile telephones, the antenna radiating element may be located and carried in one half of the mobile telephone case and the RF-transceiver may be carried in the other half of the mobile telephone case wherein a coaxial cable is used to make the RF connection between the antenna radiating element and the RF transceiver located a distance apart in the two halves of the mobile telephone case.

It would be desirable therefore to integrate multiple antenna radiating elements inside the mechanics of a wireless device to provide now known and/or future developed cellular and non-cellular system communication antenna functionality with minimal if any increase in the component part count of the wireless device.

It would also be desirable to provide an RF connection between the RF transceiver and an integrated antenna radiating element carried inside the mechanics of a mobile telephone wherein the RF connection and antenna radiating element are carried on the same flexible substrate.

It is a specific goal of the present invention therefore to employ flex-rigid technology to manufacture the radiating elements of the cellular and/or non-cellular system antennas of the wireless device such as a mobile telephone in the same PWB manufacturing process as the wireless device motherboard.

SUMMARY OF THE INVENTION

According to a broad aspect of the present invention, a wireless device antenna is presented and comprises a first main printed wiring board and a second printed wiring board mechanically and electrically interconnected by a flexible element.

In a first embodiment, the wireless device antenna comprises a first main printed wiring board and a second printed wiring board having a first major surface and an oppositely disposed second major surface for carrying at least one radiating element. The radiating element has a suitable length and width and pattern to provide an intended antenna functionality. The second printed wiring board is flexibly coupled to the first main printed wiring board for positioning the at least one radiating element in a desired position in the wireless device. A second radiating element having a suitable length and width and pattern defining a second antenna functionality may also be arranged on at least a second portion of the one of the first and second major surfaces of the second printed wiring board.

The invention further contemplates multiple radiating elements each of which radiating elements has a suitable length and width and pattern each defining a respective different antenna functionality. The multiple radiating elements are arranged on different portions of the first and second major surfaces from the at least first portion of the one of the first and second major surfaces of the second printed wiring board.

The wireless device antenna may further comprise the first main printed wiring board being a rigid printed wiring board and a flexible element defined by one or more dielectric layers of the first main printed wiring board and extending therefrom, and the second printed wiring board being defined by at least a portion of the flexible element. The second printed wiring board is flexibly coupled to the first main printed wiring board by the flexible element.

Alternatively, the first main printed wiring board is a rigid printed wiring board and the second printed wiring board is a rigid printed wiring board. A flexible element is defined by one or more dielectric layers common to the first main printed wiring board and the second printed wiring board and extends continuously there-between and therewith. The second printed wiring board is flexibly connected to the first main printed wiring board by the flexible element.

Alternatively, the first main printed wiring board is rigid and the second printed wiring board further comprises a portion of at least one dielectric layer of the first main printed wiring board extending a pre-determined length beyond the rigid first main printed wiring board.

The wireless device antenna may further comprise one or more RF transmission lines extending between and electrically connecting the first radiating element carried on the major surface of the second printed wiring board and RF transceiver circuitry carried on a major surface of the first main printed wiring board.

The second printed wiring board may be arranged to carry at least one surface mount device (SMD) RF functional circuit component on one or both of the first major surface and a second major surface disposed opposite the first major surface. One or more RF transmission lines may be provided extending between and electrically connecting the RF transceiver circuitry and the SMD RF functional circuit component for carrying control signals for tuning the first printed radiating element to carry out the intended antenna functionality.

The wireless device antenna intended antenna functionality may include cellular antenna functionality, non-cellular antenna functionality and both cellular and non-cellular antenna functionalities.

The RF transmission line may be a stripline transmission line, a microstrip transmission line, or a coplanar waveguide transmission line construction and typically a 50 ohm transmission line.

The stripline transmission line may further comprise a portion of at least one metallization layer common to the first main printed wiring board and the second printed wiring board and extend continuously there-between and therewith wherein the portion of the at least one metallization layer is appropriately configured as a strip conductor sandwiched in a predefined spaced relationship between two dielectric layers common to the first main printed wiring board and the second printed wiring board and extending continuously there-between and therewith wherein one of the dielectric layers defines an upper ground plane and the other of the dielectric layers defines a lower ground plane.

The microstrip transmission line may further comprise a portion of at least one metallization layer common to the first main printed wiring board and the second printed wiring board and extending continuously there-between and therewith wherein the portion of the at least one metallization layer is appropriately configured as a strip conductor arranged in a predefined spaced relationship with a dielectric layer common to the first main printed wiring board and the second printed wiring board and extending continuously there-between and therewith wherein the dielectric layer defines a ground plane.

The coplanar waveguide transmission line may further comprise a portion of at least one metallization layer common to the first main printed wiring board and the second printed wiring board and extend continuously there-between and therewith wherein the portion of the at least one metallization layer is appropriately configured as a strip conductor arranged with suitable side ground planes.

In a further embodiment, the wireless device antenna comprises a first main printed wiring board, and a second printed wiring board having a first major surface for carrying at least one radiating element having a suitable length and width and pattern on its surface to provide an intended antenna functionality. A flexible element integrally continuous with the first main printed wiring board and the second printed wiring board flexibly coupling the first main printed wiring board and the second wiring board for positioning the second printed wiring board in a desired orientation and location with respect to the first printed wiring board. The flexible element also provides an RF transmission line for carrying RF signals between RF transceiver circuitry carried on the first main printed wiring board and the at least one radiating element carried on said second printed wiring board.

In a further aspect of the invention, an electronic device for wireless operation comprises a wireless device antenna further comprising a first main printed wiring board, and a second printed wiring board. The second printed wiring board has a first major surface and an oppositely disposed second major surface for carrying at least one radiating element to provide an intended antenna functionality. The second printed wiring board is flexibly coupled to the first main printed wiring board for positioning the at least one radiating element in a desired position in the electronic device. The first main printed wiring board may be a rigid printed wiring board. A flexible element is defined by one or more dielectric layers of the first main printed wiring board and extending therefrom. The second printed wiring board is defined by at least a portion of the flexible element and is flexibly coupled to the first main printed wiring board by the flexible element.

Alternatively, the said first main printed wiring board is a rigid printed wiring board and the second printed wiring board is a rigid printed wiring board. A flexible element is defined by one or more dielectric layers common to the first main printed wiring board and the second printed wiring board and extends continuously there-between and therewith. The second printed wiring board is flexibly connected to the first main printed wiring board by the flexible element.

Alternatively, the first main printed wiring board is rigid and the second printed wiring board further comprises a portion of at least one dielectric layer of the first main printed wiring board extending a pre-determined length beyond the rigid first main printed wiring board.

One or more RF transmission lines are provided between and electrically connecting the first radiating element carried on the major surface of the second printed wiring board and RF transceiver circuitry carried on a major surface of the first main printed wiring board.

The second printed wiring board is arranged to carry at least one surface mount device (SMD) RF functional circuit component on one or both of the first major surface and a second major surface disposed opposite the first major surface. One or more RF transmission lines are provided extending between and electrically connecting the RF transceiver circuitry and the SMD RF functional circuit component for carrying control signals for tuning the first printed radiating element to carry out the intended antenna functionality.

In a yet further aspect of the invention, a method for providing antenna functionality in an electronic device for wireless operation comprises the steps of providing a wireless device antenna comprising the further steps of: providing a first main printed wiring board; providing a second printed wiring board having a first major surface and an oppositely disposed second major surface for carrying at least one radiating element having a suitable length and width and pattern to provide an intended antenna functionality; and flexibly coupling the second printed wiring board to the first main printed wiring board for positioning the at least one radiating element in a desired position in the electronic device for wireless operation.

Alternatively, the method includes the step of providing a second radiating element having a suitable length and width and pattern defining a second antenna functionality arranged on at least a second portion of the one of the first and second major surfaces of the second printed wiring board.

Yet alternatively, the method includes the step of providing multiple radiating elements each of the radiating elements having a suitable length and width and pattern each of which define a respective different antenna functionality, and the step of arranging each of the radiating elements on different portions of the first and second major surfaces from the at least first portion of the one of the first and second major surfaces of the second printed wiring board.

BRIEF DESCRIPTION OF THE DRAWINGS

Other features, objects and advantages of the present invention will become readily apparent from the following written description taken in conjunction with the drawings wherein.

WRITTEN DESCRIPTION OF PREFERRED EMBODIMENTS

Figures 2, 3, 4, 5, 6:
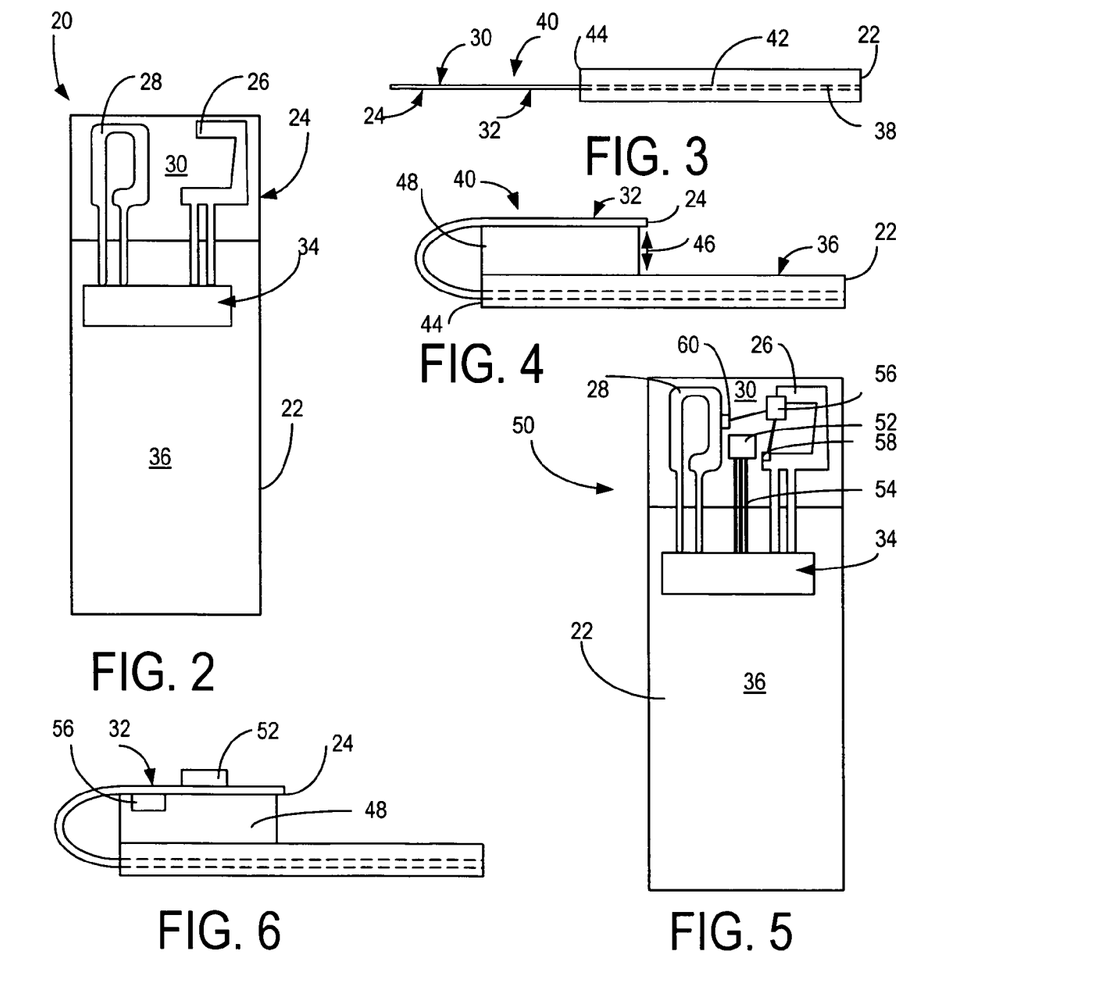
FIG. 2 illustrates schematically in a top plan view one side of the wireless device antenna in a first embodiment of the present invention.
FIG. 3 is a side schematic view of the wireless device antenna illustrated in FIG. 2.
FIG. 4 is a side schematic elevational view of the wireless device antenna illustrated in FIG. 2 showing the flexible portion folded or bend and the radiating part located and held in a spaced relationship to the main printed wiring board by a plastic separator form carried on the main printed wiring board.
FIG. 5 illustrates schematically in a top plan view one side of the wireless device antenna in a second embodiment of the present invention showing surface mount devices (SMD) carried by the radiating part.
FIG. 6 is a side schematic elevational view of the wireless device antenna illustrated in FIG. 5 showing the flexible portion folded or bent and the radiating part located and held in a spaced relationship to the main printed wiring board by a plastic separator form carried on the main printed wiring board.

Turning now to the drawings, a wireless device antenna embodying the present invention is illustrated schematically in FIGS. 2-4 and is generally designated 20 and includes a first main printed wiring board 22 such as for example the motherboard in a wireless device. The first main printed wiring board 22 has a first major surface 36 for carrying RF transceiver circuitry generally designated 34. A second printed wiring board 24 has a first major surface 30 and an oppositely disposed second major surface 32 for carrying at least one radiating element 26, 28 to provide an intended antenna functionality. The second printed wiring board 24 is flexibly coupled to the first main printed wiring board 22 for positioning the radiating element 26, 28 in a desired position and orientation in the wireless device. The first main printed wiring board 22 and the second printed wiring board 24 are constructed or made in the same manufacturing process or step and which construction preferably employs flex-rigid printed wiring board technology. The radiating elements 26, 28 have a suitable length and width and pattern defining a respective antenna functionality and may be formed from a printed conductive ink, conductive metal foil, or in other ways commonly known and used by those skilled in the art to carry out the intended function. The second printed wiring board 24 is defined by at least a portion 40 of the flexible element 38 which is made up of one or more dielectric layers 42 of the first main printed wiring board 22 and which portion 40 of the dielectric layers 42 extend beyond the end 44 of the first main printed wiring board. As illustrated in FIG. 4, the second printed wiring board 24 is folded or bent such that the portion 40 of the dielectric layers defining the second printed wiring board are bent over the first main printed wiring board 22 such that the second printed wiring board 24 is held in a spaced, predefined distance 46 with respect to the major surface 36 of the first main printed wiring board 22. A plastic separator form or other suitable spacer generally designated 48 carried on the surface 36 of the first printed wiring board 22 is utilized to hold the second printed wiring board 24 in the defined spaced relationship with the surface 36. The separator form 48 is commonly known and used for such purposes. It can also be seen that bending or folding the second printed wiring board 24 to place it in a stacked, spaced relationship with a portion of the first main printed wiring board 22 reduces the size and length of an enclosure or case for the wireless device that would ordinarily be otherwise necessary to accommodate the printed wiring board and the radiating element. Also, in this configuration as shown in FIG. 4, the surface 36 also functions as the ground plane for the radiating element carried by the second printed wiring board 24. In addition, the separator form 48 may also be utilized as an acoustic cavity to carry out the audio functionality of the wireless device with which the wireless device antenna embodying the present invention is utilized.

Referring now to FIGS. 5 and 6, a wireless device antenna generally designated 50 is illustrated therein in a second embodiment of the invention wherein the second printed wiring board 24 is arranged to carry surface mount devices (SMD) which may be utilized, for example, tuning the radiating elements 26, 28 carried on the surface 30 of the second printed wiring board 24. In the illustrated embodiment, SMD 52 may carry control circuitry which is electrically connected to the RF transceiver 34 via leads 54 to receive the appropriate electronic control signals to adjust the tuning of the radiating elements 26, 28 by controlling the electronic tuning circuitry carried in the SMD 56 which is electrically connected to the radiating elements 26, 28 at points 58, 60 respectively to change the tuning characteristics of the radiating element pattern as well known and understood by those skilled in the art.

Figure 7:
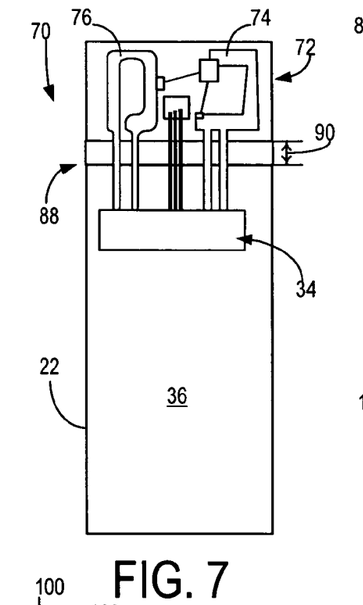
FIG. 7 illustrates schematically in a top plan view one side of the wireless device antenna in a third embodiment of the present invention wherein the main printed board and the radiating part printed wiring board are rigid and connected by an integral continuous flexible portion.
Figure 8:
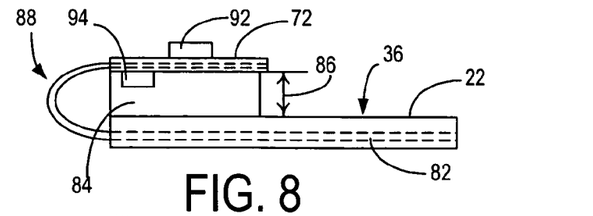
FIG. 8 is a side schematic elevational view of the wireless device antenna illustrated in FIG. 7 showing the flexible portion folded or bent and the rigid radiating part located and held in a spaced relationship to the main printed wiring board by a plastic separator form carried on the main printed wiring board.

Turning now to FIGS. 7 and 8, the wireless device antenna is illustrated in a third embodiment and generally designated 70 and includes a first main printed wiring board 22 having a major surface 36 for carrying RF transceiver circuitry generally designated 34. The second printed wiring board generally designated 72 is rigid and manufactured and fabricated at the same time and as part of the same flex-rigid printed wiring board technology process as the main printed wiring board 22 and is flexibly connected to the first main printed wiring board by a flexible element generally designated 88. The flexible element 88 is defined by one or more dielectric layers 82 common to the first main printed wiring board 22 and the second printed wiring board 72 and which dielectric layers 82 extend continuously between the first main printed wiring board 22 and the second printed wiring board 72 such that the portion 90 of the dielectric layers 82 defines the flexible element 88 and permits the second printed wiring board 72 to be folded over in a spaced, stacked relationship with the first main printed wiring board 22 in a similar manner as illustrated in FIGS. 4 and 6 wherein the second printed wiring board 72 is held a spaced distance 86 from the surface 36 of the first main printed wiring board 22 by a separator form 84. The thickness of the first main printed wiring board 22 and the second printed wiring board 72 may be different and preferably the second printed wiring board 72 is very much more thinner than the thickness of the first main printed wiring board 22. The second printed wiring board 72 may carry surface mount devices (SMD) 92, 94 in a similar manner as illustrated in FIGS. 5 and 6.

Figure 9:
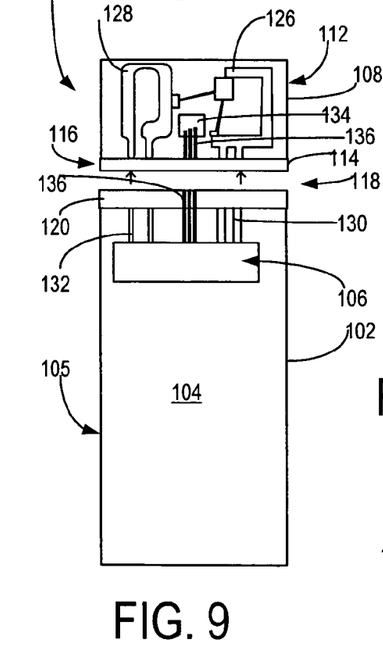
FIG. 9 illustrates schematically in a top plan view one side of the wireless device antenna in a fourth embodiment of the present invention wherein the flexible radiating part includes a printed connector for interconnection with a mating connector carried on the main printed wiring board.
Figure 10:
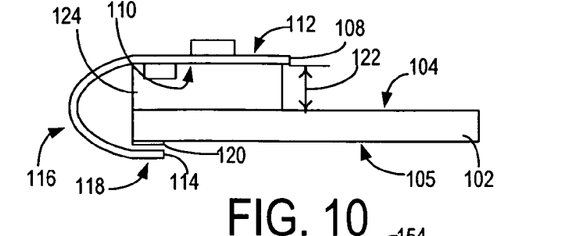
FIG. 10. is a side schematic elevational view of the wireless device antenna illustrated in FIG. 9 showing the flexible portion folded or bent and the flexible radiating part located and held in a spaced relationship to the main printed wiring board by a plastic separator form carried on the main printed wiring board.

A wireless device antenna generally designated 100 is illustrated schematically in FIGS. 9 and 10 in a fourth embodiment of the present invention. The mobile device antenna 100 includes a first main printed wiring board 102 with a first major surface 104 for carrying RF transceiver circuitry generally designated 106 and an oppositely disposed second major surface 105. The second printed wiring board 108 includes a first major surface 110 for carrying radiating elements 126, 128. A flexible element generally designated 116 is defined by a portion of the flexible printed wiring board 108 and includes a connector 114 at the end 118 for inter-engaging connection with a mating connector 120 carried on the surface 105 of the first main printed wiring board 102 for flexibly coupling the second printed wiring board 108 to the first main printed wiring board 102. The radiating elements 126, 128 are electrically connected to the RF transceiver circuitry 106 via respective RF transmission lines 130, 132 via the connector 114 and 120. The second printed wiring board 108 is also arranged to carry surface mount devices (SMD) for example 134 which is electrically connected to the RF transceiver circuitry 106 via lead 136 also carried by the connectors 114, 120.

Figure 11:
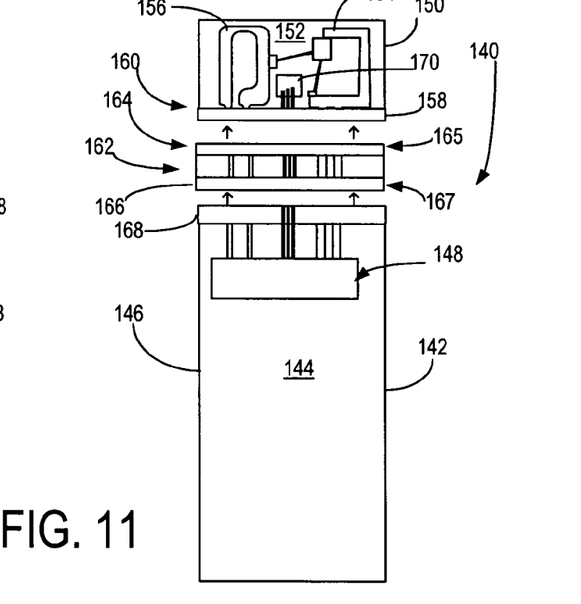
FIG. 11 illustrates schematically in a top plan view one side of the wireless device antenna in a fifth embodiment of the present invention wherein the main printed wiring board and the radiating part printed wiring board are rigid and include a printed connector for interconnection with corresponding mating connectors printed on the flexible portion.
Figure 12:
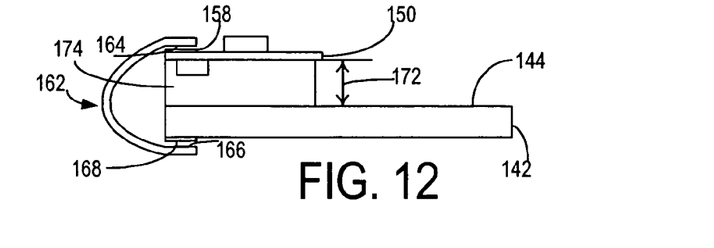
FIG. 12. is a side schematic elevational view of the wireless device antenna illustrated in FIG. 11 showing the flexible portion connecting the rigid main printed wiring board and the radiating part printed wiring board and the rigid radiating part located and held in a spaced relationship to the main printed wiring board by a plastic separator form carried on the main printed wiring board.

A wireless device antenna is illustrated in FIGS. 11 and 12 in a fifth embodiment of the present invention and is generally designated 140 and includes a first main printed wiring board 142 flexibly coupled to a second printed wiring board 150 by a separate flexible element generally designated 162. The first main printed wiring board 142 includes a first major surface 144 for carrying RF transceiver circuitry 148 and an oppositely disposed second major surface 146. The second printed wiring board 150 includes a first major surface 152 for carrying radiating elements 154, 156. A connector 158 is defined at one end 160 of the flexible second printed wiring board 150. The flexible element 162 includes a connector 164 formed at one end 165 of the flexible element 162 for inter-engaging connection with the connector 158 of the second printed wiring board 150. A second connector 166 is arranged at the opposite end 167 of the flexible element 162 for inter-engagement connection with a connector 168 carried on the first main printed wiring board 142. The flexible element 162 carries transmission lines from the radiating elements 154, 156 and leads from the control circuitry 170 on the second printed wiring board to the RF transceiver circuitry 148 on the first main printed wiring board. The second printed wiring board 150 is maintained in a spaced relationship and distance 172 with respect to the first major surface 144 of the first main printed wiring board 142 by means of a separator form 174.

Figure 13:
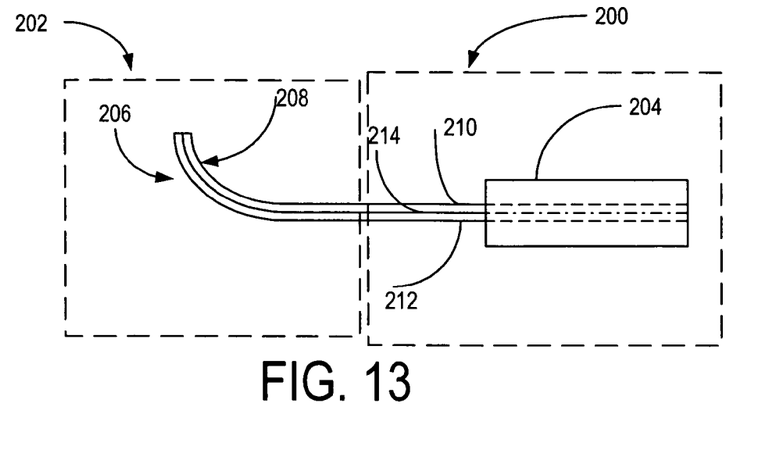
FIG. 13 is a schematic view showing two halves of a wireless device wherein the first main printed wiring board carrying the RF transceiver circuitry is located in one half and flexibly coupled by a flexible element to the second printed wiring board carrying the radiating element located in the other half by an RF transmission line formed by the flexible element.

Turning now to FIG. 13, a wireless device having two portions such as a main body portion represented by the dash line box 200 and a cover portion represented by the dash line box 202 wherein one portion is arranged to move relative to the other portion such as in a foldable cellular phone, slideable cellular phone, clamshell cellular phone or other similar enclosure wireless devices is shown therein. As illustrated in FIG. 13, the first main printed wiring board 204 is located in the main body element portion 200 and the second printed wiring board 206 is located in the second portion 202 wherein the radiating element is carried on the surface 208. As described above, the first main printed wiring board 204 is flexibly coupled to the second printed wiring board 206 by dielectric layers 210, 212 forming a part of the first main printed wiring board and extending continuously therefrom to form the second printed wiring board 206. Electrical signals are carried from the first main printed wiring board located in the first section 200 to the radiating element located on the second printed wiring board 206 by means of a metallization layer 214 also extending from the first main printed wiring board 204 and forming a part of the second printed wiring board 206. The metallization layer is arranged and is preferably configured to function as a fifty (50) ohm transmission line between the RF transceiver circuitry carried on the first main printed wiring board 204 and the radiating element carried on the second printed wiring board 206.

Figure 14:
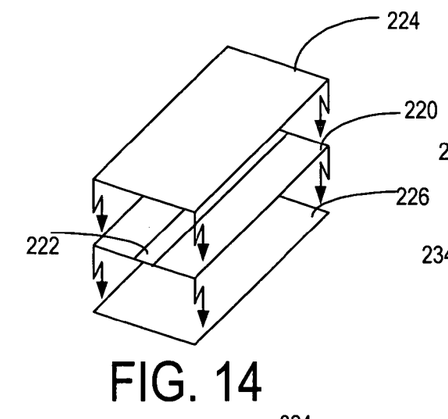
FIG. 14 is a schematic perspective exploded view of a metallization layer arranged as a strip conductor sandwiched by dielectric layers extending between the first main printed wiring board and the second printed wiring board to from a stripline transmission line.
Figure 15:
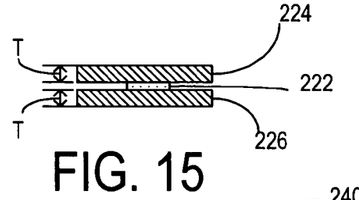
FIG. 15 is a schematic cross section view of a stripline transmission line formed by a suitably configured metallization layer sandwiched by dielectric layers.
Figure 16:
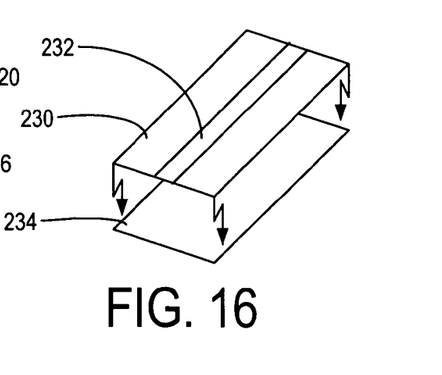
FIG. 16 is a schematic perspective exploded view of a metallization layer arranged as a strip conductor adjacent a dielectric layer extending between the first main printed wiring board and the second printed wiring board to from a microstrip transmission line.
Figure 17:
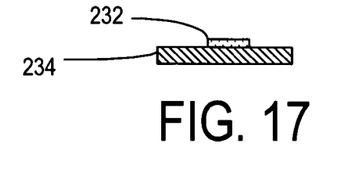
FIG. 17 is a schematic cross section view of a microstrip transmission line formed by a suitably configured metallization layer adjacent a dielectric layer in a printed wiring board.
Figures 18, 19:
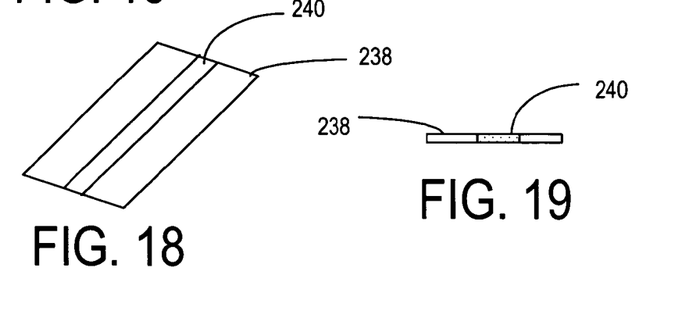
FIG. 18 is a schematic perspective view of a metallization layer extending between the first main printed wiring board and the second printed wiring board suitably arranged as a strip conductor to form a coplanar waveguide transmission line.
FIG. 19 is a schematic cross section view of a coplanar waveguide transmission line formed by a suitably configured metallization layer in a printed wiring board.

The RF transmission line formed between and connecting the RF transceiver circuitry to the radiating element may be formed as a stripline transmission line as illustrated in FIGS. 14 and 15, a microstrip transmission line as illustrated in FIGS. 16 and 17 or a coplanar waveguide transmission line as illustrated in FIGS. 18 and 19. The stripline transmission line illustrated in FIGS. 14 and 15 is formed by sandwiching the metallization layer 220 which is provided with an appropriately configured strip conductor 222 between two dielectric layers 224, 226. The metallization layers and dielectric layers extend continuously from the first main printed wiring board to the second printed wiring board wherein one of the dielectric layers 224 defines an upper ground plane and the other of dielectric layers 226 defines a lower ground plane. The dielectric layers typically have a thickness "T" of about 100 micrometers which thickness is a suitable thickness to function as a ground plane. FIGS. 16 and 17 illustrate a microstrip transmission line wherein the metallization layer 230 has an appropriately formed strip conductor 232 and is adjacent a dielectric layer 234 which functions as the ground plane wherein the strip conductor 232 provides a fifty (50) ohm RF transmission line between RF transceiver circuitry carried on the first main printed wiring board and the radiating element carried on the second wiring board. FIGS. 18 and 19 illustrate schematically a coplanar waveguide wherein the metallization layer 238 includes an appropriately configured strip conductor 240 which functions as a fifty (50) ohm RF transmission line between RF transceiver circuitry carried on the first main printed wiring board and the radiating element carried on the second printed wiring board. The coplanar waveguide is generally adequate for closest point attachment wherein the radiating element is relatively close to the RF transceiver circuitry as is well known and understood by those skilled in the art. In distances greater than about 10 millimeters between the RF transceiver circuitry and the radiating element, it is preferable to use a microstrip transmission line or a stripline transmission line. It will be obvious that multiple metallization layers may be utilized with the appropriate separation of dielectric layers to carry RF signals between the RF transceiver circuitry and the radiating elements.

The invention claimed:

1. Wireless device antenna, comprising:
   a first main printed wiring board,
   a second printed wiring board;
   a flexible element configured and being defined by one or more dielectric layers of said first main printed wiring board and extending therefrom, and
   said second printed wiring board being defined by at least a portion of said flexible element and arranged for flexible coupling to said first main printed wiring board by said flexible element, and
   at least one radiating element suitably configured and arranged to provide an intended antenna functionality and carried on a portion of one or more surfaces of said first main printed wiring board, said second printed wiring board and said flexible element.

2. The wireless device antenna as defined in claim 1 further arranged with a second suitably configured radiating element defining a second intended antenna functionality and arranged on at least another portion of said one or more surfaces of said first main printed wiring board, said second printed wiring board or said flexible element spaced from said at least one radiating element.

3. The wireless device antenna as defined in claim 1 further including multiple suitably configured radiating elements each defining a respective different intended antenna functionality and arranged on a different portion of said one or more surfaces of said first main printed wiring board, said second printed wiring board or said flexible element, said radiating elements being spaced from one another.

4. The wireless device antenna as defined in claim 1 further comprising:
   said first main printed wiring board configured as a rigid printed wiring board.

5. The wireless device antenna as defined in claim 1 further comprising:
   said first main printed wiring board configured as a rigid printed wiring board, and
   at least a portion of said second printed wiring board configured as a rigid printed wiring board.

6. The wireless device antenna as defined in claim 1 wherein said first main printed wiring board is configured as a rigid printed wiring board and said second printed wiring board further comprises a portion of at least one dielectric layer of said first main printed wiring board is arranged for extending a pre-determined length beyond said rigid first main printed wiring board.

7. The wireless device antenna as defined in claim 1 further configured with suitable RF transceiver circuitry carried on said one or more surfaces of said first main printed wiring board and one or more RF transmission lines extending between and suitably arranged for electrically connecting said radiating element and said RF transceiver circuitry carried on said first main printed wiring board.

8. The wireless device antenna as defined in claim 1 further comprising:
   said second printed wiring board being arranged to carry at least one surface mount device (SMD) RF functional circuit component on one or both of a first major surface and a second major surface disposed opposite said first major surface, and
   one or more RF transmission lines extending between and configured for electrically connecting said RF transceiver circuitry and said SMD RF functional circuit component for carrying suitable control signals for tuning said at least one suitably configured radiating element for providing the intended antenna functionality.

9. The wireless device antenna as defined in claim 1 configured such that said intended antenna functionality includes cellular antenna functionality.

10. The wireless device antenna as defined in claim 1 configured such that said intended antenna functionality includes non-cellular antenna functionality.

11. The wireless device antenna as defined in claim 1 configured such that said intended antenna functionality includes both cellular and non-cellular antenna functionality.

12. The wireless device antenna as defined in claim 7 configured such that said one or more RF transmission lines are arranged as a stripline transmission line and further are arranged as a portion of at least one metallization layer common to said first main printed wiring board and said second printed wiring board and extending continuously there-between and therewith such that said portion of said at least one metallization layer is appropriately configured as a strip conductor sandwiched in a predefined spaced relationship between two dielectric layers common to said first main printed wiring board and said second printed wiring board and extending continuously there-between and therewith such that one of the dielectric layers defines an upper ground plane and the other of the dielectric layers defines a lower ground plane.

13. The wireless device antenna as defined in claim 7 configured such that said one or more RF transmission lines are configured as a microstrip transmission line and further are arranged as a portion of at least one metallization layer common to said first main printed wiring board and said second printed wiring board and extending continuously there-between and therewith such that said portion of said at least one metallization layer is appropriately configured as a strip conductor arranged in a predefined spaced relationship with a dielectric layer common to said first main printed wiring board and said second printed wiring board and extending continuously there-between and therewith such that the dielectric layer defines a ground plane.

14. The wireless device antenna as defined in claim 7 wherein said one or more RF transmission lines are configured as a coplanar waveguide transmission line and further are arranged as a portion of at least one metallization layer common to said first main printed wiring board and said second printed wiring board and extending continuously there-between and therewith such that said portion of said at least one metallization layer is appropriately configured as a strip conductor arranged with suitable side ground planes.

15. Wireless device antenna, comprising:
a first main printed wiring board, and
a second printed wiring board arranged with a first major surface for carrying at least one suitably configured radiating element for providing an intended antenna functionality, and
a flexible element configured and defined by one or more dielectric layers of said first main printed wiring board and extending therefrom, and said second printed wiring board being defined by at least a portion of said flexible element and flexibly coupled to said first main printed wiring board by said flexible element for positioning said second printed wiring board in a desired orientation and location with respect to said first printed wiring board and further configured for providing an RF transmission line for carrying RF signals between RF transceiver circuitry carried on said first main printed wiring board and said at least one radiating element carried on said second printed wiring board.

16. An electronic device for wireless operation comprising:
a wireless device antenna comprising:
a first main printed wiring board;

a flexible element configured and being defined by one or more dielectric layers of said first main printed wiring board and extending therefrom,
a second printed wiring board arranged with a first major surface and an oppositely disposed second major surface for carrying at least one suitably configured radiating element for providing an intended antenna functionality,
said second printed wiring board being further being defined by at least a portion of said flexible element and configured for flexible coupling to said first main printed wiring board by said flexible element for positioning said at least one suitably configured radiating element in a desired location and orientation in the electronic device.

17. The electronic device as defined in claim 16 further comprising:
said first main printed wiring board configured as a rigid printed wiring boards.

18. The electronic device as defined in claim 16 further comprising:
said first main printed wiring board configured as a rigid printed wiring board and at least a portion of said second printed wiring board configured as a rigid printed wiring board.

19. The electronic device as defined in claim 16 wherein said first main printed wiring board is configured as a rigid printed wiring board and said second printed wiring board further comprises a portion of at least one dielectric layer of said first main printed wiring board arranged for extending a pre-determined length beyond said rigid first main printed wiring board.

20. The electronic device as defined in claim 16 further configured with suitable RF transceiver circuitry carried on said first main printed wiring board, and
one or more RF transmission lines extending between and suitably arranged for electrically connecting said at least one-suitably configured radiating element carried on said second printed wiring board and said RF transceiver circuitry carried on said first main printed wiring board.

21. The electronic device as defined in claim 16 further configured with suitable RF transceiver circuitry carried on said first main printed wiring board and said second printed wiring board arranged for carrying at least one surface mount device (SMD) RF functional circuit component on one or both of said first major surface and said second major surface, and
one or more RF transmission lines extending between and suitably arranged for electrically connecting said RF transceiver circuitry and said SMD RF functional circuit component for carrying suitable control signals for tuning said at least one suitably configured radiating element for providing the intended antenna functionality.

22. Method, comprising,
providing antenna functionality in an electronic device configured for wireless operation and arranged with a wireless device suitably configuring a first main printed wiring board
and a flexible element configured and defined by one or more dielectric layers of said first main printed wiring board and extending therefrom and a second printed wiring board defined by at least a portion of said flexible element and flexibly coupled to said first main printed wiring board by said flexible element and arranged for carrying on a portion of one or more surfaces of said first main printed wiring board, said second printed wiring board and said flexible element at least one radiating element suitably configured in accordance with an intended antenna functionality and positioning said at least one suitably configured radiating element in a desired orientation and location in the electronic device.

23. The method as defined in claim 22 further including arranging a second suitably configured radiating element defining a second intended antenna functionality on at least a second portion of said one or more surfaces of said first printed wiring board, said second printed wiring board or said flexible element.

24. The method as defined in claim 22 further including arranging multiple suitably configured radiating elements each defining a respective different intended antenna functionality and carried on a different portion of said one or more surfaces of said first main printed wiring board, said second printed wiring board or said flexible element, said radiating elements being spaced from one another.

25. Apparatus, comprising:
- a flexible element means, for flexibly coupling a first printed wiring board and a second printed wiring board configured and defined by one or more dielectric layers extending from said first printed wiring board at least a portion of said flexible element defining said second printed wiring board, for positioning said second wiring board in a desired orientation and location with respect to said first printed wiring board, and
- a radiating element means, for providing an intended antenna functionality, carried on one or more surfaces of said first main printed wiring board, said second printed wiring board and said flexible element means.

* * * * *

UNITED STATES PATENT AND TRADEMARK OFFICE
CERTIFICATE OF CORRECTION

PATENT NO. : 7,289,069 B2  Page 1 of 1
APPLICATION NO. : 11/029632
DATED : October 30, 2007
INVENTOR(S) : Tero Ranta

It is certified that error appears in the above-identified patent and that said Letters Patent is hereby corrected as shown below:

In column 12, line 19, claim 17, line 4 "boards" should be --board--.

In column 12, line 59, claim 22, line 4 after "device" --antenna-- should be inserted.

Signed and Sealed this

Twenty-ninth Day of April, 2008

JON W. DUDAS
*Director of the United States Patent and Trademark Office*